United States Patent [19]

Stokoe

[11] Patent Number: 4,605,256
[45] Date of Patent: Aug. 12, 1986

[54] LOCKING TOOL FOR MANIPULATION OF ELECTRONIC COMPONENTS

[75] Inventor: Philip T. Stokoe, North Attleboro, Mass.

[73] Assignee: Augat Inc., Mansfield, Mass.

[21] Appl. No.: 664,568

[22] Filed: Oct. 25, 1984

[51] Int. Cl.⁴ .......................... B25J 1/02; H05K 13/04
[52] U.S. Cl. ........................................ 294/99.2; 29/758
[58] Field of Search ................. 294/8.5, 11, 15, 16, 294/33, 99.2; 24/542–547, 555–556, 561–564; 29/747, 750, 758, 764, 740; 128/321, 354

[56] References Cited

U.S. PATENT DOCUMENTS

| | | | |
|---|---|---|---|
| 1,198,958 | 9/1916 | Risley | 294/99.2 |
| 2,064,591 | 12/1936 | David | 24/543 |
| 2,331,604 | 10/1943 | Gamache et al. | 294/99.2 |
| 3,137,880 | 6/1964 | Kubit et al. | 294/99.2 X |
| 3,253,327 | 5/1966 | McElligatt | 294/99.2 X |
| 3,317,989 | 5/1967 | Cull | 294/99.2 X |
| 4,389,912 | 6/1983 | Dallons et al. | 294/99.2 X |

Primary Examiner—Johnny D. Cherry
Attorney, Agent, or Firm—Weingarten, Schurgin, Gagnebin & Hayes

[57] ABSTRACT

A tool for positive capture and manipulation of electronic components is disclosed, having a U-shaped frame with legs ending in two confronting spaced ends each of which possesses a hook for capturing and grasping an electronic component, and further having a biased cross-bar between the legs, one end of which interacts with an opening in one of the legs, permitting the legs to adopt an open stance in response to their biasing, or holding the legs locked in a closed position until finger pressure on the cross-bar releases them.

9 Claims, 15 Drawing Figures

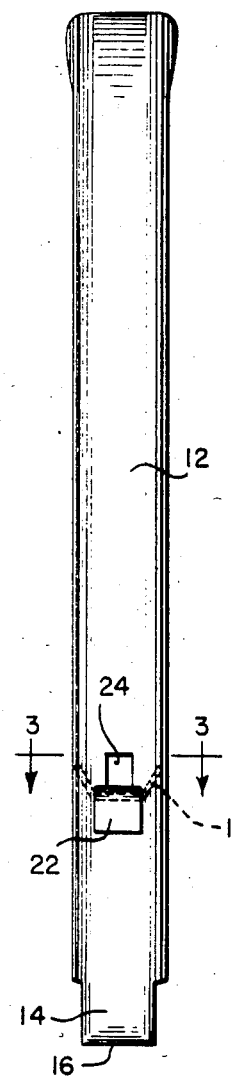
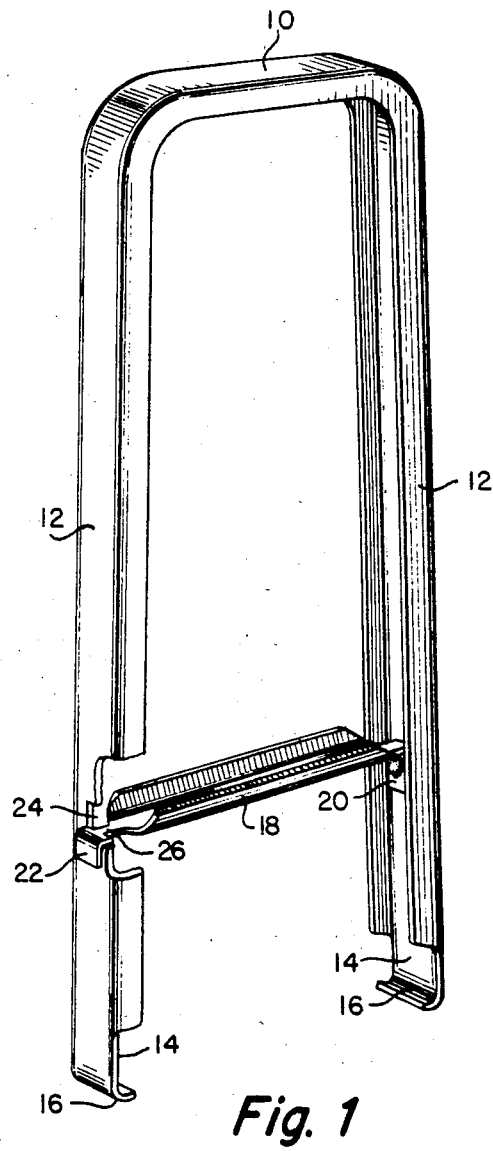
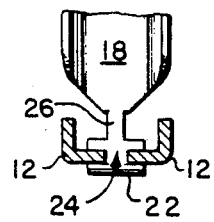
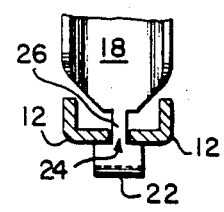
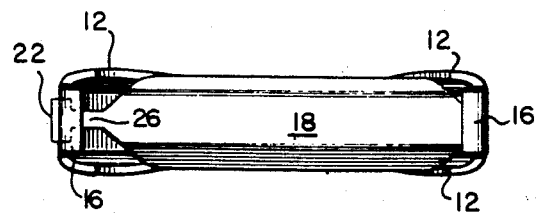
Fig. 2
Fig. 1
Fig. 3
Fig. 3A
Fig. 4

LOCKING TOOL FOR MANIPULATION OF ELECTRONIC COMPONENTS

FIELD OF THE INVENTION

This invention involves tools for handling small parts, and more particularly, tools for capturing small electronic components and manipulating them in hard-to-reach places.

BACKGROUND OF THE INVENTION

There is a great variety of tools for picking up and manipulating small objects, ranging for example from the simplest tongs and magnetized screwdrivers to extremely complex remote control arms. Many of these tools, such as tongs or pliers, require that the operator maintain his grip if the purchase of the tool on the piece being handled is not to be lost. Others, such as certain forceps and locking pliers, can be locked in a closed position on the piece being handled. Many of the locking manipulative tools are relatively large, clumsy, otherwise not particularly well adapted for manipulation of small electronic components, or too expensive for the task.

Electronic assemblies are frequently very crowded environments in which it can be dangerous, difficult, or impossible to handle components with the fingers. Accordingly, it is desirable to have tools which are small, easily operable by one hand, and which can grasp electronic components firmly, capturing them so that they can be manipulated vigorously in any orientation for placing them into position in or removing them from electronic assemblies. The tool of the present application admirably fulfills these requirements. It is elegantly simple, easily operable by one hand, lockable onto components to be handled by a simple two-finger squeezing motion, and is able to capture and retain the components being handled until the operator chooses to disengage the tool by a simple one-finger motion.

SUMMARY OF THE INVENTION

A simple tool for grasping electronic components for inserting them into and removing them from hard-to-reach places is disclosed. The tool possesses a U-shaped frame with two confronting spaced ends each having a hook for capturing and grasping an electronic component, the frame being biased so the ends tend to spring apart in the absence of a restraining mechanism. A cross-bar is located between the legs of the frame, one end being attached to one of the legs, the other end protruding through an opening in the other leg and held within that opening while permitting the cross-bar end portion to move within the opening. The opening in the leg and the end portion of the cross-bar associated with it are mutually configured to mate in either of two positions, corresponding to the open and closed positions of the tool. The cross-bar is biased so that its moveable end portion springs into a detent position in the opening when the frame legs are squeezed together, thereby holding the legs in their closed position. Upon application of a bias-opposing force to the cross-bar, it is released from this detent position in the opening and the frame legs are allowed to spring apart to their open position.

BRIEF DESCRIPTION OF THE DRAWING

The invention will be more fully understood from the following detailed description taken in conjunction with the accompanying drawing, in which:

FIG. 1 is a perspective view of a tool of the invention, partially cut away;

FIG. 2 is a side view of the tool of FIG. 1;

FIG. 3 is a partial cross-sectional view along line 3—3 of FIG. 2, particularly illustrating the way in which the end portion of the cross-bar interacts with the opening in the frame leg when the tool is in open position;

FIG. 3A is a partial cross-sectional view along line 3—3 of FIG. 2, particularly illustrating the way in which the end portion of the cross-bar interacts with the opening in the frame leg when the tool is in closed position;

FIG. 4 is a bottom view of the tool shown in FIG. 1;

DETAILED DESCRIPTION OF THE INVENTION

Figure 5:
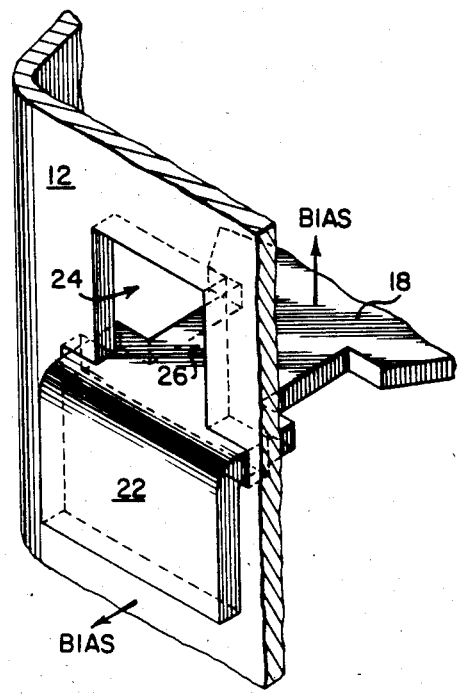
FIG. 5 is an enlarged perspective view of the locking mechanism, showing the opening in the frame leg and the end portion of the cross-bar, with the tool in open position.

Referring to FIG. 1 there is shown a tool for inserting electronic components into hard-to-reach places, having a U-shaped frame 10 with legs 12 having confronting ends 14 and hooks 16 which attach to an electronic component to capture and grasp it. A cross-bar 18 is located between legs 12, and is attached to one of the legs at position 20, the other end of cross-bar 18 projecting through an opening in the second leg and being held movably within that opening by bent tip 22. FIG. 1 illustrates the tool in the open position. A partial view of the opening 24 in frame leg 12 is shown in FIG. 2, which also illustrates bent tip 22 of cross-bar 18.

FIGS. 3 and 3A illustrate the interaction of opening 24 and cross-bar end portion 26 with the tool in its open and closed positions, respectively, and also show that in the embodiment illustrated, both the U-shaped frame 10 and the cross-bar 18 are U-shaped or channel-shaped in cross-section. Cross-bar end portion 26 is T-shaped and projects through opening 24 in frame leg 12. In the open position of the tool, the wide part of cross-bar end portion 26 is held within the wide part of opening 24, while in the tool's closed position the narrow parts of opening 24 and cross-bar end portion 26 interact to hold legs 12 closer together than in their open configuration. This will be more clearly illustrated in FIGS. 5 and 5A below.

FIG. 4 shows cross-bar 18, hooks 16, and bent tip 22, the tool being viewed from the bottom in open position.

Figure 5A:
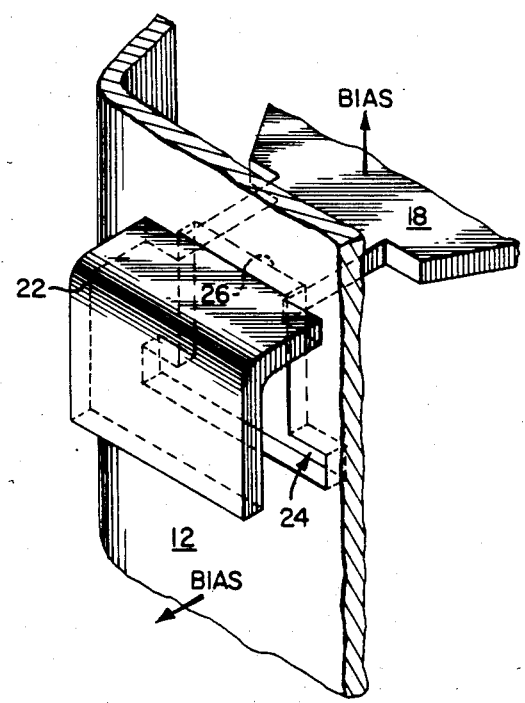
FIG. 5A is an enlarged perspective view of the locking mechanism, showing the opening in the frame leg and the end portion of the cross-bar, with the tool in closed position.

FIGS. 5 and 5A illustrate the details of the locking mechanism and show the respective configurations and relative positions of opening 24 and cross-bar end portion 26, with the tool in open and closed positions, respectively. Both the opening 24 in frame leg 12 and the cross-bar end portion 26 are seen to be T-shaped, with the wide part of opening 24 sized to accommodate the wide part of cross-bar end piece 26, and the narrow part of opening 24 being sized to accommodate the narrow part of cross-bar end piece 26. The length of the narrow part of cross-bar end piece 26 is several times the thickness of frame leg 12, to permit manual holding of workpieces which are slightly too small for the tool to lock onto. In the illustrations, cross-bar 18 is biased to spring upwards away from the frame ends 14, and frame legs 12 are biased to spring apart. When the tool is in the open position, the wide part of opening 24 holds the wide part of cross-bar end piece 26 and end piece 26 is prevented from pulling out of hole 24 by the bent tip 22. When frame legs 12 are squeezed together, cross-bar 18 is pushed through opening 24 until the narrow part of cross-bar end portion 26 encounters the narrow part of opening 24, whereupon cross-bar 18 springs upward, locking legs 12 in the closed position, as shown in FIG. 5A. To cause the tool to open, cross-bar 18 is pushed down by a bias-opposing force until the wide part of cross-bar end portion 26 is aligned with the wide part of opening 24, whereupon legs 12 spring apart and return the tool to the open position as shown in FIG. 5.

Figure 6:
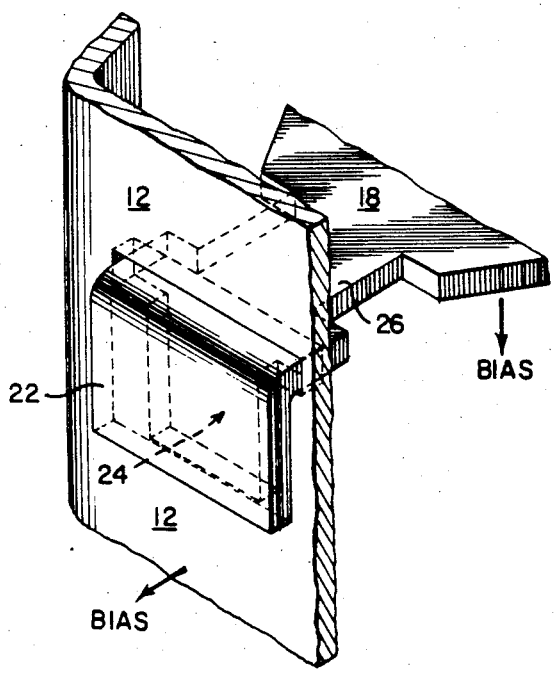
FIG. 6 is an enlarged perspective view of an alternative embodiment of the tool of the invention, in open position.
Figure 6A:
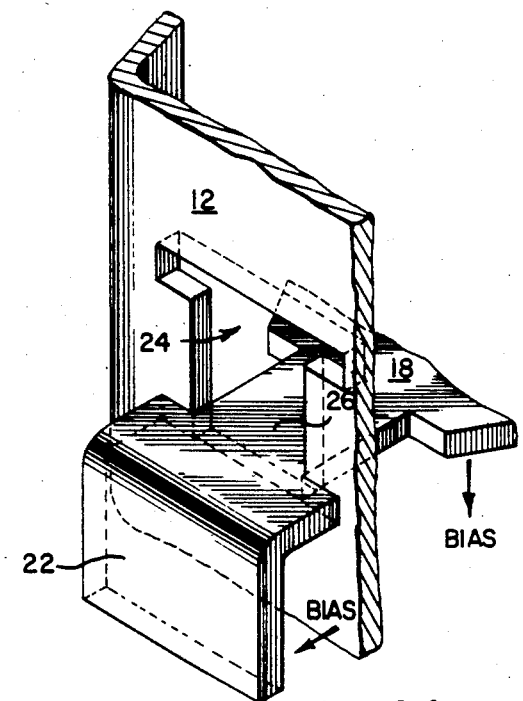
FIG. 6A is an enlarged perspective view of the alternative embodiment of the invention shown in FIG. 6, in closed position.

FIGS. 6 and 6A illustrate an alternative embodiment of the tool of the invention. Its elements and principles of operation are the same as those of the embodiment shown in FIGS. 5 and 5A, the only difference being that in this alternative embodiment the orientation of opening 24 and the direction of biasing of cross-bar 18 have been reversed. The direction of bending of bent tip 22 is immaterial.

Figure 7:
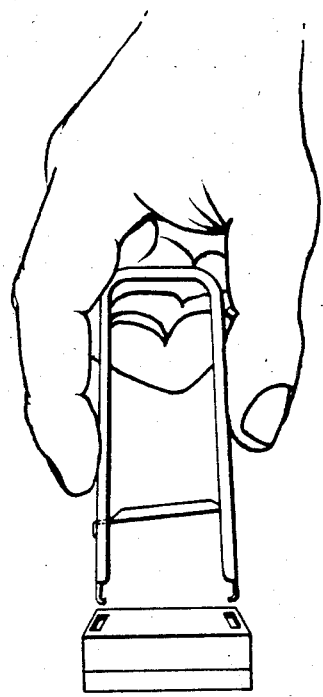
FIG. 7 illustrates the tool of the invention about to grasp an electronic component.
Figure 8:
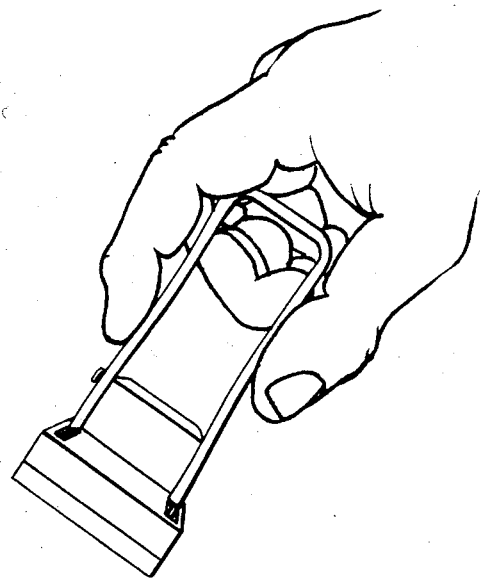
FIG. 8 illustrates the tool of the invention grasping an electronic component.
Figure 9:
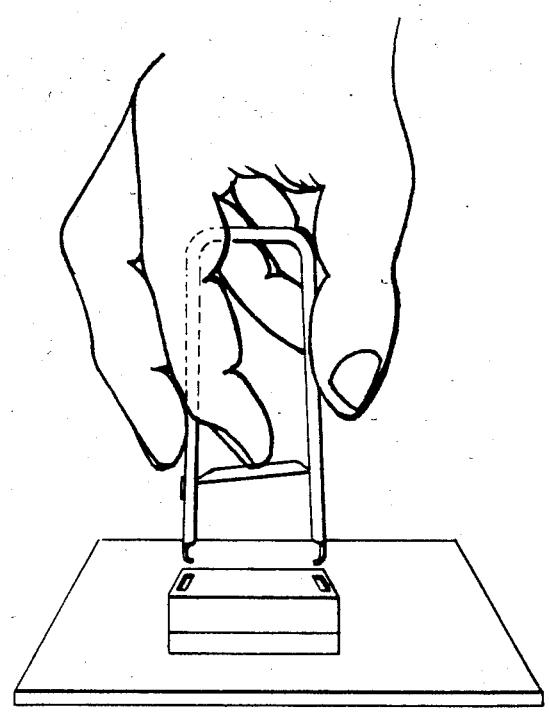
FIG. 9 illustrates the operation of releasing the electronic component by appropriate pressure on the cross-bar of the tool.
Figure 10:
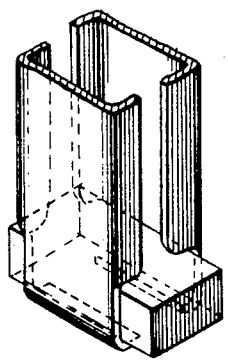
FIG. 10 is a perspective view of a tool of the invention grasping an electronic component from the side.
Figure 11:
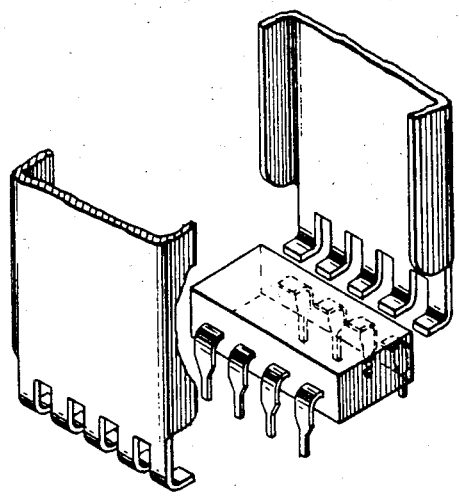
FIG. 11 is a perspective view of a tool of the invention with notched hooked ends, about to grasp an integrated circuit.
Figure 12:
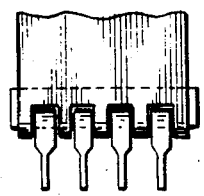
FIG. 12 is a side view of a tool of the invention grasping an integrated circuit, showing the relationship between the notched hooked ends of the tool and the pins of the integrated circuit.

FIGS. 7, 8 and 9 illustrate the use of the tool in picking up and grasping an electronic component, placing it where desired, then releasing it by appropriate pressure on the cross-bar 18. FIG. 10 illustrates the tool being used to grasp a component by the sides, rather than by openings in the component as shown in FIGS. 7-9. FIG. 11 shows that hooks 16 may be notched or otherwise configured as desired to adapt them for use on variously-shaped components such as integrated circuits. FIG. 12 shows a side view of a tool having notched hooked ends grasping a dual-in-line electronic component such as an integrated circuit having leads projecting from its sides. It will be noted that in operation, once the tool has been closed upon an electronic component or other part having a width slightly larger than the spacing between confronting ends 14 when the tool is in closed position, the tool grasps that component firmly and does not require further application of squeezing pressure by the operator. The operator may then change hand positions and manipulate the assembly as he desires, and finally release the component when he wishes, by the application of a slight finger pressure to the cross-bar, to overcome its biasing. The part is not released until the operator releases it deliberately. On the other hand, if the electronic component or other part being grasped is somewhat smaller in width than the spacing between confronting ends 14 when the tool is in closed position, the tool can still grasp the item firmly so long as the operator maintains his grip. In this instance legs 12 are squeezed together until the narrow part of cross-bar end portion 26 is pushed out through opening 24, beyond the normal closed position. In the event the item to be grasped is so small that in a miniature tool legs 12 would be too close together for finger operation of cross-bar 18, a normal-sized tool is employed, in which the lower sections of legs 12 located between cross-bar 18 and leg ends 14 are bent so as to bring ends 14 into close proximity to each other.

Changes and modifications in the specifically described embodiments can be carried out without departing from the scope of the invention which is intended to be limited only by the scope of the appended claims.

What is claimed is:

1. A locking tool having defined open and closed positions, for manipulation of electronic components, comprising:

a U-shaped frame having first and second legs constituting the sides of the U, each leg having an end, each leg end having at least one hook attachable to an electronic component, said frame being biased so said legs tend to spring apart;

said first leg having a T-shaped hole therethrough, said hole having a wider first part contiguous with a relatively narrower second part;

a cross-bar connecting said legs, said cross-bar having a body, a fixed end, and a moveable end, said moveable end being T-shaped and having a wider first section contiguous with a relatively narrower second section connected in turn to said cross-bar body;

said fixed end of said cross-bar being attached to said second leg, opposite the hole in said first leg;

said moveable end of said cross-bar projecting through the hole in said first leg;

the wider first section of said cross-bar moveable end having a bend operative to hold said wider first section of said cross-bar moveable end within the wider first part of said T-shaped hole and to establish the limit to which the tool can open;

the wider part of said hole accommodating the wider first section of said cross-bar moveable end, and the narrower part of said hole accommodating the relatively narrower section of said cross-bar moveable end;

said cross-bar being biased and said T-shaped hole being oriented such that upon squeezing together of the legs of said frame, the narrower second section of said cross-bar moveable end springs into the narrower second part of said T-shaped hole, holding the legs in a closed position to grasp and retain an electronic component until bias-opposing force is applied to said cross-bar, bringing the wider first part of said T-shaped hole and the wider first section of said cross-bar moveable end into alignment and permitting the frame legs to spring apart, releasing the component.

2. A tool according to claim 1 wherein said hooks are configured for insertion into respective openings in an electronic component to be grasped.

3. A tool according to claim 1 wherein said hooks are configured to grasp the side and confronting bottom face of an electronic component to be grasped.

4. A tool according to claim 3 wherein said hooks are notched, the notches being so sized and spaced as to receive leads of the electronic component to be grasped.

5. The tool of claim 1 wherein said T-shaped hole has its wider part toward the end of said first leg, and the cross-bar is biased to spring away from the leg ends.

6. A tool of claim 1 wherein said U-shaped frame and said cross-bar are constructed of material having a U-shaped cross-section.

7. A tool according to claim 6 wherein said hooks are formed by removal of the sides of the frame leg ends and the bending in of the distal ends thereof.

8. A tool according to claim 1 wherein the relatively narrower second section of the cross-bar moveable end is several times as long as the frame leg is thick.

9. A locking tool as recited in claim 1, wherein said bend in the wider first section of said moveable end of the cross-bar is sufficiently distant from the relatively narrower second section of said moveable end to constitute a desired differential between the open and closed positions of the tool.

* * * * *